(12) United States Patent
Kim

(10) Patent No.: US 7,470,605 B2
(45) Date of Patent: Dec. 30, 2008

(54) METHOD FOR FABRICATION OF A MOS TRANSISTOR

(75) Inventor: Jong Min Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 198 days.

(21) Appl. No.: 11/446,040

(22) Filed: May 30, 2006

(65) Prior Publication Data
US 2006/0276017 A1    Dec. 7, 2006

(30) Foreign Application Priority Data
Jun. 1, 2005    (KR)  ............... 10-2005-0046588

(51) Int. Cl.
*H01L 21/28*    (2006.01)
*H01L 21/44*    (2006.01)
(52) U.S. Cl. ............... 438/583; 438/575; 438/576; 257/412; 257/610
(58) Field of Classification Search ............... 438/575, 438/576, 577, 583; 257/412, 610, 611, 612
See application file for complete search history.

(56) References Cited

U.S. PATENT DOCUMENTS 6,072,222 A *   6/2000   Nistler ............... 257/383
2004/0224450 A1 *   11/2004   Itonaga et al. ............ 438/197

* cited by examiner

*Primary Examiner*—Phuc T Dang
(74) *Attorney, Agent, or Firm*—Andrew D. Fortney

(57) ABSTRACT

Disclosed is a method for fabricating a MOS transistor. The present method includes the steps of: (a) forming a gate electrode including a gate insulating layer and a polysilicon gate conductive layer on an active region in a semiconductor substrate; (b) forming a metal layer over the substrate including the gate electrode; (c) heat-treating the substrate to form a polycide layer on a top surface and sidewalls of the gate electrode; (d) removing an unreacted portion of the metal layer; (e) removing the polycide layer from the top surface and sidewalls of the gate electrode, thus reducing a width of the gate electrode; and (f) forming source and drain regions in the active region adjacent to the gate electrode.

12 Claims, 3 Drawing Sheets

METHOD FOR FABRICATION OF A MOS TRANSISTOR

This application claims the benefit of Korean Application No. 10-2005-0046588, filed on Jun. 1, 2005, which is incorporated by reference herein in its entirety.

BACKGROUND OF THE INVENTION

1. Field of the Invention

The present invention relates to a semiconductor device and a fabrication method thereof, more specifically, to a metal-oxide-semiconductor (MOS) transistor and a method for fabricating the same.

2. Description of the Related Art

Advance in the integration of a semiconductor device results in decreasing the size of MOS transistors constituting integrated circuits. Conventionally, a dimension of a gate electrode and a transistor channel length are determined by a photolithography technique for patterning the gate electrode, yet the resolvability of the photolithography technique reaches certain limits, due to limitations of the photolithography equipment and materials. A variety of complementary measures, using an anti-reflection layer, deep ultraviolet (DUV) light, immersion technology, etc., have been developed to overcome the limits of photolithography process, yet still there are limits to fabrication of an ultra-miniaturized, e.g., nano-scale gate electrode. Currently, the widely used light source of KrF has been evaluated to be applicable up to 100 nm technology. However, this light source has limitations on application to 60 nm~20 nm technologies.

SUMMARY OF THE INVENTION

It is, therefore, an object of the present invention to provide a method for forming a MOS transistor gate having a critical dimension less than the minimum feature size resolvable by the photolithography equipment used to make the transistor.

To achieve the above objects, an embodiment of a method for fabricating a MOS transistor, according to the present invention, comprises the steps of: (a) forming a gate electrode comprising a gate insulating layer and a polysilicon gate layer on an active region in a silicon semiconductor substrate; (b) forming a metal layer over the substrate including the gate electrode; (c) heat-treating the substrate to form a polycide layer on a top surface and sidewalls of the gate electrode; (d) removing an unreacted portion of the metal layer; (e) removing the polycide layer from the top surface and sidewalls of the gate electrode, thus forming a reduced-width gate electrode; and (f) forming source and drain regions in the active region adjacent to the gate electrode.

The present method may further comprise the step of forming a lightly doped region by implanting a first dopant in a low concentration in the active area of the substrate using the gate electrode and the polycide layer as an ion-implantation mask. Preferably, after the step (e), the method further comprises halo-implanting a second dopant, having a conductive type opposite to the first dopant, in the active region using the reduced-width gate electrode as a mask.

Furthermore, it is preferable that the step (f) comprises the steps of: (f1) forming a gate spacer on the sidewalls of the reduced-width gate electrode; and (f2) forming source and drain regions by implanting a dopant having a conductive type identical to the first dopant in a high concentration in the active region of the substrate using the reduced-width gate electrode and the gate spacer as an ion-implantation mask. Especially, the metal layer can comprise at least one member selected from the group consisting of cobalt, titanium, nickel, tungsten, platinum, hafnium, and palladium.

A MOS transistor (which may be fabricated by the method according to the present invention) may comprise a gate electrode having a width narrower than a critical dimension resolvable by the photolithography equipment used to make the transistor or a width less than a critical dimension of the process technology for making the transistor. Preferably, the MOS transistor also has a lightly doped region comprising a first dopant in a low concentration in the active area of the substrate, aligned to a sidewall of either the polysilicon gate layer or a "pre-narrowed" gate electrode, the pre-narrowed gate electrode having a width equal to the critical dimension plus a difference between the critical dimension and the width of polysilicon gate layer.

These and other aspects of the invention will become evident by reference to the following description of the invention, often referring to the accompanying drawings.

DETAILED DESCRIPTION OF THE INVENTION

FIGS. 1 to 6 are cross-sectional views illustrating a method for fabricating a MOS transistor according to the present invention, which can overcome the limits of photolithography processes and equipment.

Figure 1:
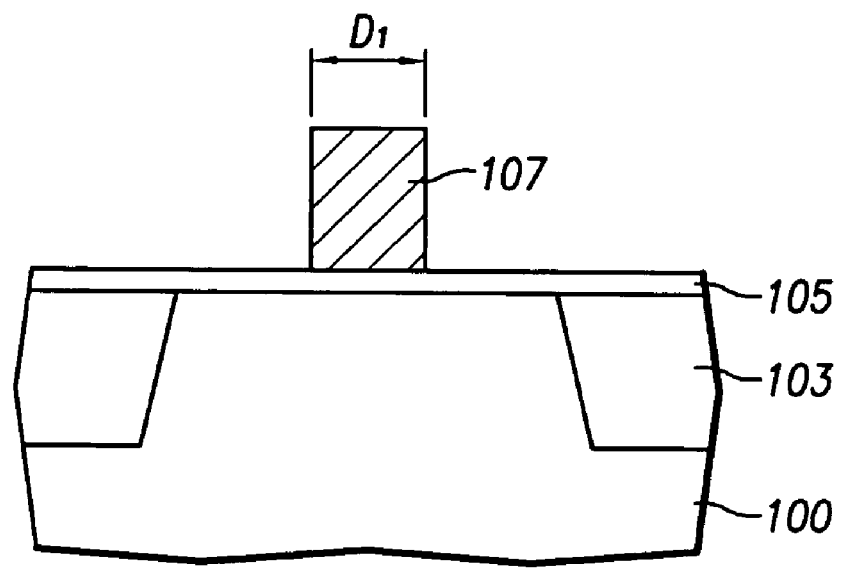
FIGS. 1 to 6 are cross-sectional views illustrating an embodiment of a method for fabricating MOS transistor according to the present invention.

Firstly, referring to FIG. 1, field regions 103 are formed to define an active region in semiconductor substrate 100 such as a silicon substrate. Formation of field regions 103 may involve, in one embodiment, etching semiconductor substrate 100 to form trenches, filling the trenches with insulating material, and planarizing a surface of substrate 100 by chemical mechanical polishing (CMP) to form shallow trench isolation (STI) structures. Alternatively, filed regions 103 may comprise conventional field oxide structures formed by local oxidation of silicon (LOCOS) or a combination of LOCOS and STI.

Next, gate insulating layer 105 and a gate conductive layer are formed in successive order on an entire surface of semiconductor substrate 100. Here, gate insulating layer 105 can comprise a silicon oxide (e.g., thermally-grown silicon dioxide), and the gate conductive layer can comprise doped polysilicon, formed by depositing amorphous silicon, ion implanting a dopant therein, and annealing to at least partially crystallize the silicon and activate at least some of the dopant.

Subsequently, the gate conductive layer is selectively etched and patterned by photolithography and etching processes to form gate electrode 107 having a width $D_1$. Preferably, the gate conductive layer is etched until gate insulating layer 105 is exposed. Gate insulating layer 105 preferably remains on the active region of substrate 100, thus preventing formation of silicide on the active region of substrate 100 by reaction of subsequently deposited metal with the silicon substrate 100 during the process for forming a polycide layer. In the case where a metal reacts with the silicon substrate to form a silicide, the silicon material of the substrate is generally consumed during the reaction. In addition, the surface of the substrate can be damaged during removal of the resultant silicide layer. Although the invention encompasses a method where the exposed gate insulating layer 105 is removed from the active region of substrate 100, in a preferred embodiment, metal for forming silicide is deposited on the exposed gate insulating layer 105 (as discussed below), for these (and possibly other) reasons.

Figure 2:
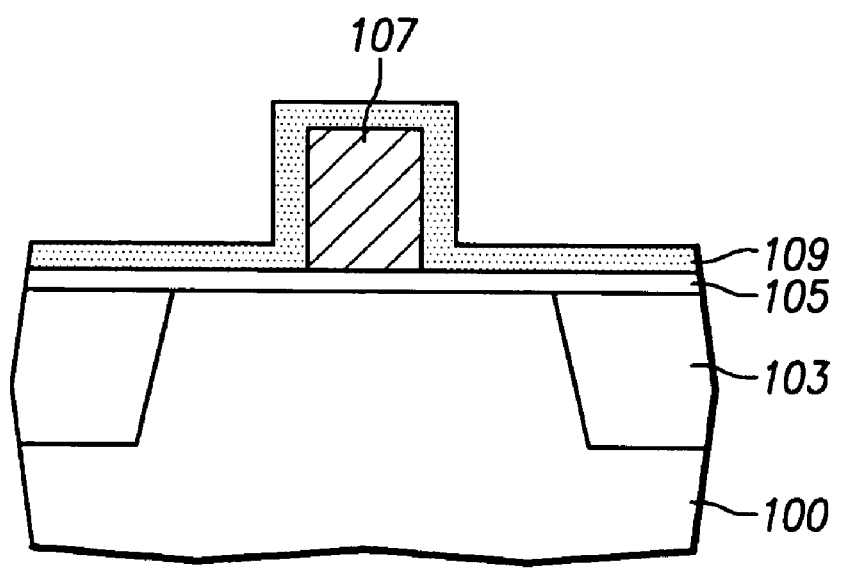

Referring to FIG. 2, metal layer 109 is formed on the exposed gate insulating layer 105 and gate electrode 107. Metal layer 109, which is generally deposited by physical vapor deposition (PVD; e.g., sputtering) or, in some cases, chemical vapor deposition (CVD) from a corresponding precursor (e.g., an organometallic compound containing the metal), can comprise at least one member selected from the group of cobalt (Co), titanium (Ti), nickel (Ni), tungsten (W), platinum (Pt), hafnium (Hf), and palladium (Pd).

Figure 3:
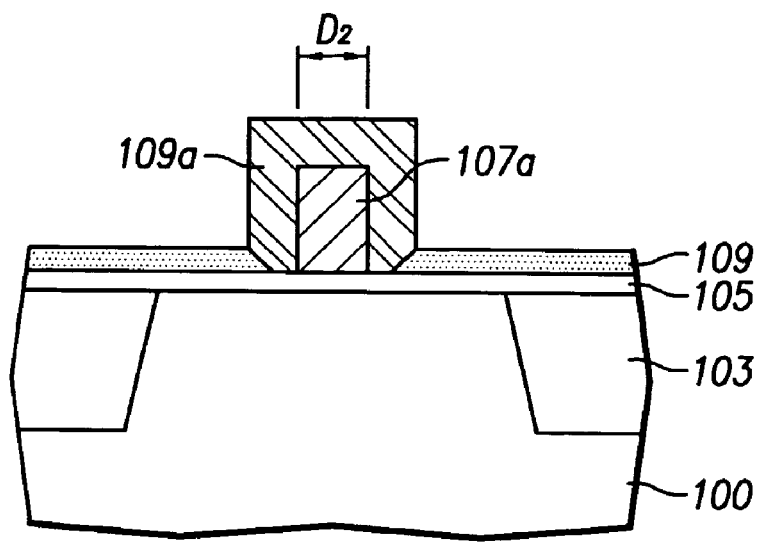

Referring to FIG. 3, the process for forming polycide on the top surface and sidewalls of gate electrode 107 is performed. More specifically, the semiconductor substrate is heated (e.g., heat-treated) at a high temperature, thereby forming one or more predetermined chemical compound(s) at interfaces between gate electrode 107 and metal layer 109, by reaction of a (poly)silicon material with the metal. Such compound layer 109a formed by reaction of polysilicon and metal is hereinafter called a "polycide" layer. Meanwhile, in a preferred embodiment, during the heat-treatment process, metal layer 109 does not react with the silicon material of the active region, because gate insulating layer 105 prevents metal layer 109 from directly contacting with the silicon substrate. Accordingly, polycide layer 109a can be formed selectively on the exposed surfaces (e.g., a top surface and sidewalls) of gate electrode 107. Especially, the polycidation reaction generally consumes an amount of polysilicon material relative to a thickness of metal layer 109 formed on the top surface and sidewalls of gate electrode 107, the amount of polysilicon consumed depending on reaction (e.g., annealing) conditions and the metal silicide compound formed. As a result, the width of polysilicon gate electrode decreases from the initial dimension $D_1$ to the resultant dimension $D_2$, due to consumption of the polysilicon material by polycidation (and, typically, subsequent removal of the metal silicide compound by etching the silicide selectively relative to the underlying polysilicon and, where present, gate insulating layer 105), thus resulting in gate electrode 107a having the critical dimension $D_2$ less than the minimum dimension resolvable by a photolithography process.

Figure 4:
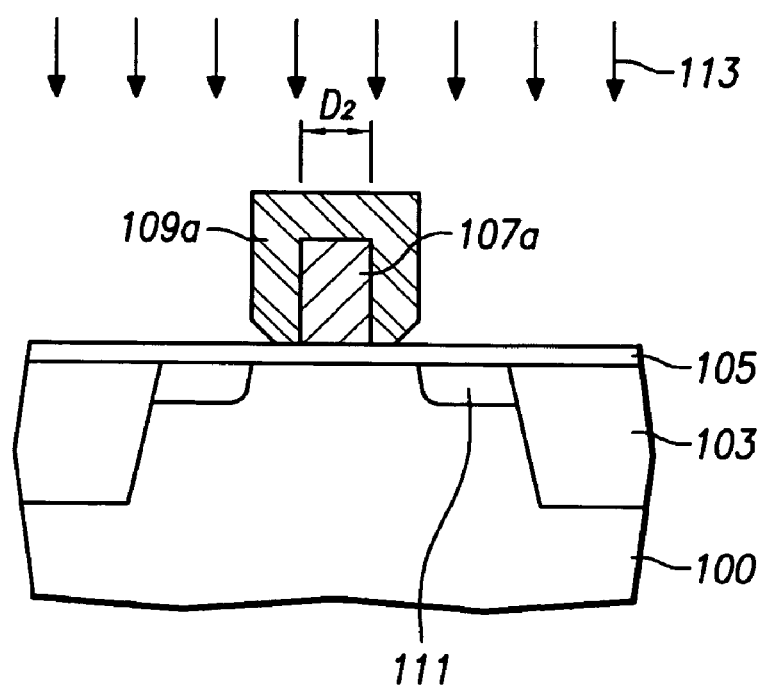

Next, referring to FIG. 4, the heat-treated semiconductor substrate undergoes a cleaning process (e.g., metal etch or selective metal removal process), thus a portion of metal material that did not react with the polysilicon material is removed, leaving polycide layer 109a remaining. In the cleaning (or metal etch) process, a mixed solution of $H_2SO_4$, $H_2O_2$, and $H_2O$ can be used as a cleaning solution (e.g., the metal etchant may comprise an aqueous mixture of $H_2SO_4$ and $H_2O_2$). Typically, such an etch process or etchant chemistry will not remove metal silicide compounds, gate insulating layer 105, or any underlying (and possibly exposed) silicon substrate 100.

Subsequently, lightly doped regions 111 are formed by ion-implantation, which involves implanting a relatively low concentration of dopants (and preferably at a relatively low energy) in the active region using gate electrode 107a, polycide layer 109a, and field regions 103 as an ion-implantation mask. Alternatively, lightly doped regions 111 can be formed after removal of polycide layer 109a in the succeeding process.

Figure 5:
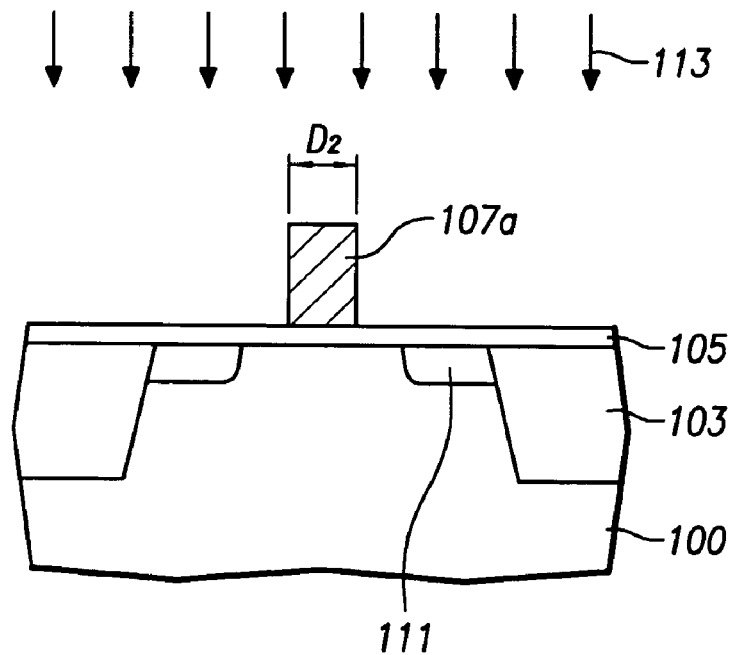

Referring to FIG. 5, the polycide layer 109a formed on the top surface and sidewalls of gate electrode 107a is removed. Polycide layer 109a is preferably removed by an isotropic etching process, which can effectively remove polycide layer 109a on the sidewalls of gate electrode 107a. The isotropic etching process preferably utilizes a wet-etch, and preferably includes an etching solution that can selectively etch a polycide material (e.g., the product formed by reaction of metal with polysilicon) relative to gate insulating layer 105 or any underlying (and possibly exposed) silicon (e.g., polysilicon gate electrode 107a or crystalline silicon substrate 100). The etching solution can be selected according to species of metal and polycide (e.g., conventional selective etchant chemistries are known for a given metal silicide).

Next, the active region of the substrate undergoes a halo ion-implantation process using the gate electrode and the field regions as an ion-implantation mask. The halo ion-implantation generally utilizes a dopant species having a conductivity type opposite to the dopant(s) in lightly doped regions 111. In the case where lightly doped regions are formed before removal of gate polycide layer 109a and the halo ion-implantation is performed after removal of gate polycide layer 109a, the halo ion-implantation regions can be formed in a separate region distant from the lightly doped regions. Therefore, a so-called "short channel" phenomenon may be effectively prevented. More specifically, first conductive type dopants are implanted in lightly doped regions 111 using polycide layer 109a as a mask, distant from lower edges of gate electrode 107a. In the case where the width of gate electrode is small, dopants in lightly doped regions 111 can diffuse toward the transistor channel region below gate electrode 107a during the subsequent heat treatment processes, thus resulting in short channel effects. The "short channel effect" induces a strong electric field at the edges of lightly doped regions 111, resulting in degradation of the performance of devices. However, according to the present invention, lightly doped regions 111 can be relatively distant from the edges of gate electrode 107a so that short channel effects can be prevented. Moreover, halo ion implantation after removal of polycide layer 109a can prevent short channel phenomenon more effectively. In one embodiment, the halo ions can be implanted at an angle.

Figure 6:
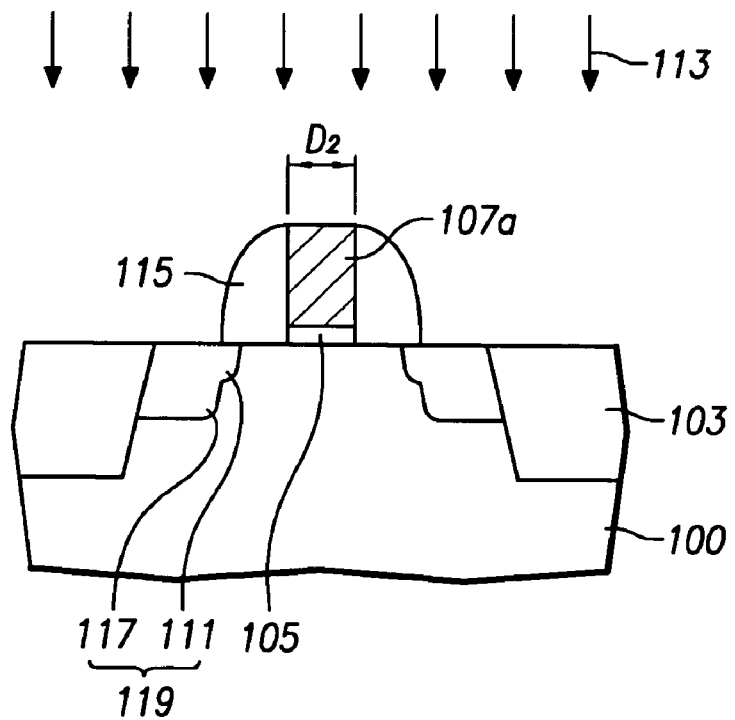

Referring to FIG. 6, a spacer insulating layer is deposited on the entire surface of the substrate, and then it is anisotropically etched until the upper surface of the substrate is exposed, thus forming gate spacers 115 on the sidewalls of gate electrode 107a. The spacing insulator layer may comprise a plurality of different insulator materials, deposited in succession. For example, a (relatively thin) oxide (e.g., silicon dioxide) layer may be deposited onto gate electrode 107a and the exposed active region of substrate 100, then a relatively thick nitride (e.g., silicon nitride) layer may be deposited onto the oxide layer. Conventional anisotropic etching then forms a multi-layered spacer, comprising an oxide buffer layer and a nitride spacer layer thereon.

Finally, high concentration dopant implantation regions 117 are formed by ion-implanting (e.g., an ion implantation process) that involves implanting a high concentration of dopants in the active region (and preferably at a relatively high energy) using gate electrode 107a, gate spacers 115, and field regions 103 as an ion-implantation mask. High concentration implantation regions 117 form the source and drain regions of the MOS transistor.

The present invention involves a conventional photolithography process (for example, having a conventional critical dimension), but can provide several tens or hundreds nanometer-sized MOS transistors having a critical dimension (or pattern width) less than the minimum dimension resolvable by the conventional photolithography equipment.

In addition, the additional polycide layer may be used as an ion-implantation mask for lightly doped drain regions of MOS transistors. When halo ion-implantation is performed after removal of the polycide layer, the halo implantation regions can be formed in a separate region of the transistor active region distant from the lightly doped drain structure. As a result, the short channel phenomenon can be effectively prevented.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating a MOS transistor, comprising the steps of:
    (a) forming a gate electrode comprising a gate insulating layer and a polysilicon gate layer on an active region of a semiconductor substrate;
    (b) forming a metal layer over the substrate including the gate electrode;
    (c) heat-treating the substrate to form a polycide layer on a top surface and sidewalls of the gate electrode;
    (d) removing an unreacted portion of the metal layer;
    (e) removing the polycide layer from the top surface and sidewalls of the gate electrode, thus reducing a width of the gate electrode; and
    (f) forming source and drain regions in the active region adjacent to the gate electrode.

2. The method of claim 1, further comprising the step of forming a lightly doped region by implanting a first dopant in a low concentration in the active area of the substrate using the gate electrode and the polycide layer as an ion-implantation mask, after the step (d).

3. The method of claim 2, further comprising the step of halo-implanting a second dopant having a conductive type opposite to the first dopant in the active region using the reduced width gate electrode as an ion-implantation mask, after the step (e).

4. The method of claim 3, wherein the step (f) comprises the steps of:
    (f1) forming a gate spacer on the sidewalls of the reduced width gate electrode; and
    (f2) forming source and drain regions by implanting a dopant having a conductive type identical to the first dopant in a high concentration in the active region of the substrate using the reduced width gate electrode and the gate spacer as an ion-implantation mask.

5. The method of claim 1, Thither comprising the steps of:
    forming a lightly doped region by implanting a first dopant in a low concentration in the active area of the substrate using the gate electrode and the polycide layer as an ion-implantation mask, after the step (d); and
    forming a gate spacer on the sidewalls of the narrowed gate electrode, after the step (e);
    wherein forming source and drain regions comprises implanting a dopant having a conductive type identical to the first dopant in a high concentration in the active region of the substrate using the reduced width gate electrode and the gate spacer as an ion-implantation mask.

6. The method of claim 1, further comprising the step of forming a lightly doped region by implanting a first dopant in a low concentration in the active area of the substrate using the reduced width gate electrode as an ion-implantation mask, after the step (e).

7. The method of claim 6, further comprising the step of halo-implanting a second dopant having a conductive type opposite to the first dopant in the active region of the substrate using the reduced width gate electrode as an ion-implantation mask, after the step of forming the lightly doped region.

8. The method of claim 7, wherein the step (f) comprises the steps of:
    (f1) forming a gate spacer on the sidewalls of the reduced width gate electrode; and
    (f2) forming source and drain regions by implanting a dopant having a conductive type identical to the first dopant in a high concentration in the active region of the substrate using the narrowed gate electrode and the gate spacer as an ion-implantation mask.

9. The method of claim 1, wherein the metal layer comprises at least one member selected from the group consisting of cobalt, titanium, nickel, tungsten, platinum, hafniumn, and palladium.

10. The method of claim 1, wherein forming the gate electrode comprises:
    forming gate insulating layer and a gate conductive layer in successive order on an entire surface of the semiconductor substrate, and
    etching the gate conductive layer to form the polysilicon gate layer and expose the gate insulating layer.

11. The method of claim 10, wherein forming the metal layer comprises depositing the metal layer on the polysilicon gate layer and the exposed gate insulating layer.

12. A MOS transistor, comprising a gate electrode having a narrower width than a critical dimension resolvable by photolithography equipment used to make the transistor, fabricated by the method of claim 1.

* * * * *